United States Patent [19]

Ikari et al.

[11] 4,305,975

[45] Dec. 15, 1981

[54] METHOD OF FORMING PRINTED CIRCUIT

[75] Inventors: Kunihiro Ikari; Katsuhiro Takahashi, both of Yokosuka; Kazuhiro Takeda, Yokohama, all of Japan

[73] Assignee: Tokyo Shibaura Denki Kabushiki Kaisha, Kawasaki, Japan

[21] Appl. No.: 212,518

[22] Filed: Dec. 3, 1980

[30] Foreign Application Priority Data

Dec. 17, 1979 [JP] Japan .................................. 54-162693

[51] Int. Cl.³ .......................... C23C 3/02; H01B 5/14
[52] U.S. Cl. ........................................ 427/97; 427/98; 427/306; 430/15
[58] Field of Search .......................... 427/98, 306, 97; 430/15, 19

[56] References Cited

U.S. PATENT DOCUMENTS 4,151,313  4/1979  Wajima et al. ........................ 427/98

FOREIGN PATENT DOCUMENTS

| | | |
|---|---|---|
| 44-19661 | 8/1969 | Japan . |
| 55-50689 | 4/1980 | Japan ..................................... 427/98 |
| 55-50690 | 4/1980 | Japan ..................................... 427/98 |
| 55-50691 | 4/1980 | Japan ..................................... 427/98 |

*Primary Examiner*—Ralph S. Kendall
*Attorney, Agent, or Firm*—Oblon, Fisher, Spivak, McClelland & Maier

[57] ABSTRACT

A printed circuit is formed by a coating the entire region of at least one main surface of an insulating substrate with a resin type adhesive layer containing a solid solution consisting of titanium oxide, nickel oxide and antimony oxide, followed by selectively forming a mask on the adhesive layer to provide the non-masked region as a circuit-forming region. Further, the circuit-forming region is treated with a solution of an oxidizing agent and, then, subjected to an activation treatment. Finally, the mask is removed and a desired conductive layer pattern is formed on the activated surface region by means of electroless plating.

15 Claims, No Drawings

METHOD OF FORMING PRINTED CIRCUIT

This invention relates to a method of forming a printed circuit and more particularly to a method of forming a conductive circuit pattern by utilizing an electroless plating.

Electronic equipments tend to be made smaller in size and higher in performance. Naturally, it is strongly requested that the printed circuit board included in an electronic equipment be made smaller in size and higher in reliability.

Recently, an additive method in which a prescribed conductive circuit pattern is selectively formed on an insulating substrate by utilizing an electroless plating attracts attention in this field as an interesting method for producing a printed circuit board. As a matter of fact, the additive method produces various merits. For example, it is possible to suppress waste of metals such as copper used for forming conductive patterns. It is also possible to provide through-holes and circuit patterns easily.

The following techniques are included in the conventional method of forming a conductive circuit pattern by an electroless plating:

1. The surface of an insulating substrate is treated with a strong oxidizing agent such as chromic acid so as to coarsen the substrate surface and make the substrate surface hydrophilic, followed by treating the substrate surface with stannous chloride, palladium chloride, etc. for the activation purpose. Then, an electroless plating is applied, with a mask put on the substrate surface region in which a conductive pattern is not formed.
2. A film on which metal is not deposited, said film containing a solid solution consisting of titanium oxide, nickel oxide and antimony oxide, is selectively formed on the surface of an insulating substrate, followed by treating the substrate surface with an oxidizing agent and an activating agent successively. Then, the substrate surface is further treated with an inorganic mixed acid containing ammonium persulfate and hydrochloric acid, followed by applying an electroless plating. Naturally, a conductive layer is not formed in the region in which the metal-resisting film has been formed in advance.
3. Palladium salt, etc. which acts as a catalyst and provides a nucleus of metal deposition in the plating step is dispersed in advance in an insulating substrate. Then, the substrate surface is treated with an oxidizing agent, with a mask put on the substrate surface region in which a conductive pattern is not formed, followed by applying an electroless plating.

However, the conventional techniques summarized above are not satisfactory in some respects. Specifically, prior art 1 is defective in that the activating agent such as stannous chloride tends to remain on the substrate surface, rendering it difficult to form a mask in tight contact with the substrate surface. It follows that a large number of pin holes are formed, with the result that a plating metal tends to be deposited in the non-circuit region as well. Prior art 2 is suitable for mass production of printed circuit boards. But, the catalyst particles deposited in a prescribed circuit-forming region tend to be removed in the treating step with the organic mixed acid. Also, a plating metal fails to be deposited satisfactorily on the side walls of the substrate defining through-holes. To be brief, prior art 2 to form a printed circuit of high reliability. Prior art 3 permits eliminating the drawback of prior art 1. But, a large amount of an expensive plating catalyst is required in prior art 3. In addition, the insulating property of the substrate is lowered.

An object of this invention is to provide a method of forming a printed circuit which permits forming a prescribed conductive pattern in a desired region alone of an insulating substrate surface.

Another object is to provide a method of forming a printed circuit by utilizing an electroless plating, which permits forming a conductive circuit pattern of high accuracy and high reliability.

According to this invention, there is provided a method of forming a printed circuit comprising the steps of:

forming on the entire region of at least one main surface of an insulating substrate a resin type adhesive layer containing a solid solution consisting of titanium oxide, nickel oxide and antimony oxide;

selectively forming a mask on the adhesive layer to provide the non-masked region as a circuit forming region;

treating the surface of the circuit-forming region with a solution of an oxidizing agent;

activating the surface region treated with the oxidizing agent;

removing the mask; and forming a desired conductive plattern layer on the activated surface region by means of electroless plating.

In this invention, it is possible to use various types of insulating substrate on which is formed a conductive circuit pattern. For example, it is possible to use as the insulating substrate a plastic board, a ceramic board, a laminate produced by pressurizing under heat a plurality of superposed sheets each prepared by impregnating a base sheet such as glass fiber or paper with a thermosetting resin. It is also possible to prepare the insulating substrate by coating the surface of a metal plate with an insulating layer. To be brief, the entire region of the substrate need not be formed of an insulating material; it suffices for at least the surface region of the substrate to exhibit an insulating property.

A resin type adhesive layer is formed on the surface of the insulating substrate in the this invention. The adhesive used in this invention is classified into diene type synthetic rubber-based adhesives and those not containing such rubber. The diene type synthetic rubbers include, for example, butadiene polymer, butadiene-acrylonitrile copolymer, isoprene rubber, chloroprene rubber, acrylonitrile-butadiene-styrene terpolymer, and a mixture of at least two of these synthetic rubbers. It is possible to add a thermosetting resin such as epoxy resin or phenolic resin to the synthetic rubber exemplified above. The adhesive containing diene type synthetic rubbers permit a conductive layer formed later to be strongly bonded to the substrate. Where the thermosetting resin is used together, the diene type synthetic rubber should be used in an amount of about 30 to 70% by weight, preferably, about 50% by weight based on the total amount of the diene type synthetic rubber and thermosetting resin.

The non-synthetic rubber type adhesives include, for example, epoxy resins such as bisphenol type epoxy resin, epoxy-novolak resin, alicyclic epoxy resin, and a mixture thereof. These epoxy resins permit producing a printed circuit board exhibiting excellent electric properties.

The adhesives of any type used in the invention may contain an inorganic filler such as silica gel, zirconium silicate or magnesium silicate, which acts as a reinforcing material. The inorganic filler should be used in an amount of 3% to 50% based on the total amount of the resin. Where the adhesive composition contains a thermosetting resin, a curing agent such as amine or acid anhydride may be added to the composition. It is also possible to add a pigment to the adhesive composition.

It is important to note that the adhesive composition should contain a solid solution consisting of titanium oxide ($TiO_2$), nickel oxide (NiO) and antimony oxide ($Sb_2O_3$). These oxides should preferably be mixed at a molar ratio of 83 ($TiO_2$):5 (NiO):12 ($Sb_2O_3$). The solid solution acts as a catalyst poison and is used in the form of particles sized about 0.1 to 5$\mu$. In general, the solid solution is used in an amount sufficient to suppress the metal deposition in the subsequent electroless plating step. Generally, the amount of the solid solution ranges between 2 and 40 parts, preferably, between 3 and 30 parts by weight relative to 100 parts of the resin contained in the adhesive composition.

The adhesive composition is applied in the form of a solution to the entire surface of the insulating substrate. Specifically, the adhesive resin is dissolved in a proper organic solvent, e.g., methyl ethyl ketone, methanol, or butyl cellosolve, so as to prepare, preferably, a varnish-like solution, followed by dispersing a desired amount of the solid solution particles in the solution. The dispersion thus prepared is coated on the entire region of at least one main surface of the insulating substrate by means of brushing, immersing, roll-coating, curtain-coating, bar-coating, etc., followed by drying and solidifying the coating so as to form an adhesive layer. Alternatively, a removable sheet such as a platic film or a metal foil is coated with the dispersion mentioned above and, then, the coating is dried. The dispersion-coated sheet is disposed on a plurality of superposed prepregs such that the coating is brought into direct contact with the uppermost prepreg, followed by pressing the laminate under heat so as to prepare an integral body. Finally, the removable sheet is peeled off or etched away so as to obtain an insulating substrate bearing an adhesive layer. The adhesive layer is usually about 10 to 100$\mu$ thick, preferably, 20 to 70$\mu$ thick, for providing a sufficient bonding strength between the conductive circuit pattern formed later and the substrate as well as a sufficient solder dip resistance.

The entire surface of the adhesive layer thus formed is covered with a masking material, followed by selectively removing the masking material so as to provide a mask. The non-masked region provides a circuit pattern-forming region. In this invention, it is possible to use ordinary masking materials. Specifically, in the manufacture of a printed circuit board using a copper-plated laminate body, an ultraviolet-curing type resist, a heat-drying type resist, etc. are used in general as the etching resist or plating resist. It is possible to use the resists mentioned above as the masking material in this invention. For example, the masking material used in this invention includes a resin composition containing as the main component prepolymers having ester groups of acrylate or methacrylate as well as additives such as a curing agent like pentaerythritoltriacrylate, a photochemical reaction initiating agent, and a resin having alkali-soluble residual groups such as carboxyl groups or phenol groups. To be more specific, "Riston" (trademark of Du Pont, Inc.), OFPR 7P (trademark of a positive photoresist produced by Tokyo Oka, Ltd., Japan), etc. can be used as the masking material in this invention.

A screening printing method, etc. can be employed for coating the entire surface of the adhesive layer with the masking material. Then, the masking layer is selectively irradiated with ultraviolet light so as to decompose or cure the irradiated portion of the masking layer, followed by removing the decomposed portion or non-cured portion of the masking layer. As a result, the adhesive layer is selectively exposed in a desired circuit pattern. Needless to say, the remaining portion of the masking layer acts as a mask in the subsequent steps.

The exposed portion of the adhesive layer is treated with an oxidizing agent for rendering the exposed adhesive layer surface suitable for accepting the subsequent plating operation. Specifically, the treatment with the oxidizing agent serves to coarsen the adhesive layer surface because the exposed adhesive layer is partially etched. In addition, the adhesive layer surface is rendered hydrophilic. The oxidizing agents used in this invention include, for example, chromic acid, salts of chromic acid, permanganate, chromic acid-fluorobic acid mixture, chromic acid-sulfuric acid mixture, and chromic acid-sulfuric acid-phosphoric acid mixture. Particularly, a mixture of chromic acid and sulfuric acid permits the conductive circuit pattern formed later to be strongly bonded to the adhesive layer.

After the treatment with the oxidizing agent, the exposed adhesive layer surface is activated for permitting a metal deposition in the subsequent electroless plating step. Specifically, palladium acting as a catalyst (or activating agent) in the electroless plating step is deposited on the exposed adhesive layer surface for the activation purpose. In this invention, the activation treatment is performed by, for example immersing the substrate in a solution acidified by hydrochloric acid and containing palladium chloride and stannous chloride. It is also possible to bring the substrate surface into contact with a stannous chloride solution acidified by hydrochloric acid and, then, with a palladium chloride solution. Alternatively, the substrate surface may be brought into contact with a solution of an organic palladium complex, followed by treatment with a weak reducing agent so as to deposit metal palladium on the exposed adhesive layer surface. The deposited palladium, i.e., catalyst, permits a sufficient deposition of a desired metal in the subsequent electroless plating step in spite of the fact that the adhesive layer contains a catalyst poision, i.e., solid solution of oxides.

After the activation treatment, the mask formed on the substrate surface is removed by treatment with an alkaline solution, e.g. an aqueous solution of sodium hydroxide, potassium hydroxide, ammonia, or alkaline amine. The mask can be removed in a short time by, for example, spraying under pressure the alkaline solution heated to about 30° to 60° C. onto the substrate surface.

Finally, an electroless plating is applied to the substrate surface so as to form a desired pattern of a conductive layer. The plating baths used in this invention are known in the art and include, for example, a copper plating bath, a nickel plating bath and a gold plating bath. Particularly suitable for this invention is an electroless copper plating bath containing, for example, copper sulfate, ethylenediamine tetracetate (or Rochelle salt), and formaldehyde. It is possible to add, as required, sodium hydroxide, dipyridyl, polyethyleneoxide, etc., to the plating bath mentioned above. In general, the plating bath is maintained at 50° to 78° C. and the pH value of the plating bath is adjusted to be about 12.0 to 13.0 during the electroless plating step.

Incidentally, through-holes are made in the substrate before forming a mask on the adhesive layer covering the substrate surface.

As apparent from the foregoing description, the entire surface of the adhesive layer containing a catalyst poison, i.e., solid solution formed of the oxides of titanium, nickel and antimony, is provided on the substrate before the electroless plating step. Nevertheless, a conductive layer is selectively formed in a desired pattern on the adhesive layer after the electroless plating operation, because the circuit-forming region of the adhesive layer surface is selectively activated in advance by depositing palladium acting as a catalyst in the electroless plating step. The particular technique permits achieving a sufficient insulation between electric circuits included in the produced printed circuit board and also permits forming fine circuit patterns leading to an enhanced density of the circuit patterns formed on the printed circuit board. It should also be noted that the conductive layer is strongly bonded to the substrate because the adhesive layer intervenes between the substrate surface and the conductive layer, with the result that the produced printed circuit board exhibits a high solder dip resistance.

As described above in detail, the method of this invention permits producing a printed circuit board having conductive circuit patterns formed at a high density and exhibiting a high reliability.

This invention will be more fully understood from the following examples.

EXAMPLE 1

An adhesive system was prepared first. Specifically, a mixture of 250 parts by weight of a methyl ethyl ketone solution containing 20% by weight of "Hycar" 1072 (trademark of a nitrile rubber produced by Nippon Zeon Co., Ltd.), 50 parts by weight of a methanol solution containing 50% by weight of "Nikanol PR-1440M" (trademark of a phenolic resin produced by Mitsubishi Gas Chemical Co., Ltd.), 31 parts by weight of a methyl ethyl ketone solution containing 80% by weight of "Epicoat 1001" (trademark of an epoxy resin produced by Shell Petrochemical Co., Ltd., Japan), 13 parts by weight of a butyl cellosolve solution containing 20% by weight of "Kayahard CLA" (trademark of an acid anhydride type resin curing agent produced by Nippon Kayaku Co., Ltd.,), 10 parts by weight of "Silica Powder #200" (trademark of Nippon Aerozyl Co., Ltd.), and 10 parts by weight of "TY-70" (trademark of a powdery solid solution consisting of titanium oxide, antimony oxide and nickel oxide, produced by Ishihara Sangyo Co., Ltd.), was well mixed with a homogenizer and, then, kneaded with a three-roll mill, followed by diluting the kneaded mixture with butyl cellosolve so as to prepare an adhesive system containing 25% by weight of the adhesive composition.

The adhesive system thus prepared was coated by using a wire bar on both surfaces of an insulating substrate 1.6 mm thick, which had been formed by laminating a plurality of paper sheets impregnated with epoxy resin, followed by heating the adhesive-coated substrate at 90° C. for 20 minutes and, then, at 165° C. for 40 minutes so as to obtain a cured adhesive layer about 40μ thick. Then, through-holes were made at prescribed points of the adhesive layer-coated substrate, followed by coating the entire surface, except the through-holes, of the adhesive layer formed on one surface of the substrate with a masking layer of "UR-450B" (trademark of an ultraviolet-curing photoresist produced by Tamura Chemical Research Institute). Further, the masking layer was selectively irradiated with ultraviolet light emitted from two high pressure mercury lamps of 80 W/cm which were moved at a conveyor speed of 6 m/min so as to cure the irradiated portion of the masking layer. Then, the non-irradiated portion was removed so as to provide a mask formed of the cured portion of the masking layer. A mask was also formed on the opposite surface of the adhesive layer-coated substrate by the same procedures.

After the masking step, the substrate was immersed for 7 minutes in a solution of an oxidizing agent consisting of 75 g/l of chromic acid, 250 ml/l of concentrated sulfuric acid and the balance of water so as to coarsen the exposed adhesive layer surface. After treatment with the oxidizing agent, the substrate was immersed in a 3% aqueous solution of sodium bisulfite so as to neutralize the excess chromium, followed by treating the substrate with an activating liquor of "6F" (trademark of Shipley Inc.).

After activation of the exposed adhesive layer surface, a 5% aqueous solution of sodium hydroxide heated to 50° C. was sprayed under a pressure of 3 kg/cm² onto the substrate surface for about 20 seconds so as to remove the mask, followed by washing the substrate with water. Finally, the substrate was immersed for 13 hours in an electroless copper plating bath of the following composition so as to form a conductive circuit pattern having a thickness of 35μ on the activated surface of the adhesive layer. Incidentally, the pH value of the plating bath was adjusted at 12.3 and the plating bath was maintained at 60° C. during the electroless plating operation.

| Electroless Plating Bath Composition | |   |
|---|---|---|
| Copper sulfate | 0.04 | mol/l |
| Ethylenediamine tetraacetate | 0.10 | mol/l |
| Formalin | 0.30 | mol/l |
| Potassium cyanide | 5 | mg/l |
| Dipyridyl | 10 | mg/l |
| Acetinol (trademark of a nonionic surfactant produced by Nippon Surfactant Co., Ltd.) | 50 | mg/l |

Copper was not deposited at all in the non-circuit region of the produced printed circuit board. In addition, the copper layer formed in the circuit portion including the walls defining the through-holes presented a very good appearance. Also, the bonding strength between the conductive layer and the substrate as well as the solder dip resistance of the printed circuit board were measured in accordance with JIS C-6481, with the result that the bonding strength was as high as 2.0 kg/cm and the solder dip resistance was as long as 40 seconds (at 260° to 262° C.).

Control 1

An additional experiment was conducted for the sake of comparison. Specifically, through-holes were made in an adhesive layer-coated insulating substrate as used in Example 1. Then, the substrate was treated with an oxidizing agent, i.e., an aqueous solution containing chromic acid and sulfuric acid, followed by activating the substrate, as in Example 1.

After the activation step, both surfaces of the substrate were selectively coated with an ink of the following composition, which contains a solid solution powder consisting of $TiO_2$, NiO and $Sb_2O_3$, by employing a silk screen printing method.

| Ink Composition | |
|---|---|
| Component | Amount (parts by weight) |
| Epicoat 1007 (trademark of epoxy resin produced by Shell Petrochemical Co., Ltd., Japan) | 65 |
| Epicoat 828 (trademark of epoxy resin produced by Shell Petrochemical Co., Ltd., Japan) | 35 |
| Eslack BL-2 (trademark of polyvinylbutyral resin produced by Sekisui Kagaku Co., Ltd.) | 2,5 |
| Silicon oxide powder (filler) | 2 |
| Calcium carbonate powder (filler) | 4 |
| Zirconium silicate powder (filler) | 2 |
| Phthalocyanine blue (pigment) | 2 |
| Solid solution powder of $TiO_2$—NiO—$Sb_2O_3$ system | 20 |
| Butyl carbitol | 40 |
| Methyl cellosolve | 10 |
| Dicyane-diamide | 5 |
| N,N,N',N'-tetramethylbutane diamine | 1.1 |

The substrate bearing the ink layer was heated at 150° C. for 40 minutes so as to dry the ink layer, thereby providing a mask formed of the dried ink layer. Naturally, the mask was formed in a manner to expose selectively the activated surface of the substrate, namely, the exposed surface formed a circuit pattern. The masked substrate was immersed for 3 minutes in an aqueous solution of "Accelerator 19" (trademark of Shipley Inc.), followed by water-washing the substrate. Finally, an electroless plating was applied to the substrate by using an electroless copper plating bath equal to that used in Example 1 so as to form a conductive circuit pattern on the substrate. Copper was found to have been deposited in the non-circuit region as well, with the result that the produced printed circuit board gave rise to short-circuit in places and, thus, failed to perform the function of a printed circuit board.

Control 2

An additional comparative experiment was conducted. Specifically, through-holes were made in an adhesive layer-coated insulating substrate equal to that used in Example 1. Then, a mask was formed on the substrate by using an ink equal to that used in Control 1, followed by treating the exposed surface of the substrate with an aqueous solution containing chromic acid and sulfuric acid and, then, with an activating liquor as in Example 1.

After the activating treatment, the substrate was immersed for 5 minutes in an aqueous solution consisting of 3.0 g/l of ammonium persulfate, 80 ml/l of 35% hydrochloric acid and the balance of water so as to remove palladium (i.e., plating catalyst) deposited in the non-circuit region, followed by water-washing the substrate. Finally, an electroless plating was applied to the substrate by using an electroless copper plating bath equal to that used in Example 1. Copper was found to have been deposited on the mask as well, indicating that the palladium removal from the non-circuit region was insufficient.

EXAMPLE 2

A printed circuit board was produced as in Example 1, except that "Ink X-70" (trademark of a heat-drying type resist produced by Taiyo Ink Co., Ltd.) was used as the masking material and the masking layer was dried at 80° C. for 10 minutes for forming the mask. The produced printed circuit board was substantially equal to that for example 1 in appearance, bonding strength between the conductive circuit pattern and the substrate, and solder dip resistance of the printed circuit board.

EXAMPLE 3

An adhesive system was prepared first. Specifically, a mixture consisting of 162 parts by weight of a methyl ethyl ketone solution containing 40% by weight of Epicoat 1007 mentioned previously, 44 parts be weight of a methyl ethyl ketone solution containing 80% by weight of Epicoat 828 mentioned previously, 15 parts by weight of a methyl ethyl ketone solution containing 20% by weight of Eslack BL-2 mentioned previously, 10 parts by weight of Silica Powder #200 mentioned previously, 100 parts by weight of a butyl cellosolve solution containing 20% by weight of Kayahard CLA mentioned previously, 3 parts by weight of "2EMZI" (trademark of a curing accelerator produced by Shikoku Chemical Co., Ltd.), and 10 parts by weight of TY-70 mentioned previously, was treated with a homogenizer and, then, kneaded with a three-roll mill, followed by diluting the kneaded mixture with butyl cellosolve so as to prepare an adhesive system containing 30% by weight of the adhesive composition.

The adhesive system thus prepared was coated on both surfaces of an epoxy resin type laminate sheet, i.e., insulating substrate, having a thickness of 1.6 mm, followed by heating the substrate at 80° C. for 20 minutes and, then, at 160° C. for 60 minutes so as to form a cured adhesive layer 40μ thick on the substrate surface. Then, a printed circuit board was produced as in Example 1.

Copper was not deposited at all in the non-circuit region of the substrate surface. Also, the bonding strength between the conductive layer and the substrate as well as the solder dip resistance of the printed circuit board were measured in accordance with JIC C-6481, with the result that the bonding strength was as high as 1.5 kg/cm and the solder dip resistance was as long as 60 seconds (at 260° 262° C.). Further, the copper deposition on the walls defining the through-holes was found to be quite satisfactory when examined by a cross section method.

EXAMPLE 4

Through-holes were made in an adhesive layer-coated insulating substrate equal to that used in Example 1. Then, the substrate was immersed in an OFPR7P (trademark of a positive photoresist produced by Tokyo Oka, Ltd.), followed by drying the substrate so as to form a resist film 7μ thick on the entire surface of the substrate including the side walls defining the through-holes.

The resist-coated substrate was selectively exposed to light emitted from a super high pressure mercury, lamp of 2 KW for 1 minute, followed by immersing the substrate for 1 minute in a 1.5% aqueous solution of sodium hydroxide so as to remove the non-exposed portion of the resist. Naturally, the resist was selectively removed in a manner to form a circuit pattern. Then, the substrate was heated at 120° C. for 10 minutes so as to form a dried mask on the substrate surface. The masked substrate was subjected to the treatment with oxidizing agent and, then, to the activation treatment under the same conditions as in Example 1.

After the activation treatment, the mask was removed in an ordinary fashion, followed by applying an electroless copper plating to the substrate under the same conditions as in Example 1.

Copper deposition was not recognized at all in the non-circuit portion of the substrate. Also, a copper layer was formed satisfactorily in the circuit portion including the side walls defining the through-holes.

The produced printed circuit board was tested for the bonding strength between the copper layer and the substrate as well as the solder dip resistance, with the result that the bonding strength was as high as 1.8 kg/cm and the solder dip resistance was as long as 45 seconds (at 260° to 262° C.).

What we claim is:

1. A method of forming a printed circuit comprising the steps of:
   forming on the entire region of at least one main surface of an insulating substrate a resin type adhesive layer containing a solid solution consisting of titanium oxide, nickel oxide and antimony oxide;
   selectively forming a mask on the adhesive layer to provide the non-masked region as a circuit-forming region;
   treating the surface of the circuit-forming region with a solution of an oxidizing agent;
   activating the surface region treated with the oxidizing agent;
   removing the mask; and
   forming a desired conductive pattern layer on the activated surface region by means of electroless plating.

2. The method according to claim 1, wherein a diene type synthetic rubber-based adhesive is used as the adhesive.

3. The method according to claim 2, wherein the synthetic rubber is butadiene polymer, butadiene-acrylonitrile copolymer, isoprene rubber, chloroprene rubber, or acrylonitrile-butadiene-stryrene terpolymer.

4. The method according to claim 2, wherein the adhesive comprises a thermosetting resin such that the amount of the synthetic rubber falls within the range of about 30 to 70% based on the total weight of the synthetic rubber and the thermosetting resin.

5. The method according to claim 4, wherein the thermosetting resin is an epoxy resin or a phenolic resin.

6. The method according to claim 1, wherein the adhesive is an epoxy resin.

7. The method according to claim 1, wherein the adhesive comprises an inorganic filler.

8. The method according to claim 1, wherein the adhesive layer contains 2 to 40 parts by weight of the solid solution relative to 100 parts by weight of the resin.

9. The method according to claim 8, wherein the adhesive layer is about 10 to 100$\mu$ thick.

10. The method according to claim 1, wherein the oxidizing agent is a mixture of chromic acid and sulfuric acid.

11. The method according to claim 1, wherein the activation treatment is carried out by using a palladium compound.

12. The method according to claim 11, wherein the activation treatment is carried out by bringing the substrate surface treated with the oxidizing agent into contact with a solution containing palladium chloride and stannous chloride and acidified by hyrdochloric acid.

13. The method according to claim 11, wherein the activation treatment is carried out by bringing the substrate surface treated with the oxidizing agent into contact with a stannous chloride solution acidified by hydrochloric acid and, then, with a palladium chloride solution.

14. The method according to claim 11, wherein the activation treatment is carried out by bringing the substrate surface treated with the oxidizing agent into contact with an organic palladium complex solution, followed by treatment with a weak reducing agent.

15. The method according to claim 1, wherein through-holes are made in the adhesive layer-coated substrate after step (a) and before step (b).

* * * * *